(12) United States Patent
Kusano et al.

(10) Patent No.: US 12,194,671 B2
(45) Date of Patent: Jan. 14, 2025

(54) INFORMATION PROCESSING APPARATUS, MOLDING APPARATUS, MOLDING METHOD, AND ARTICLE MANUFACTURING METHOD

(71) Applicant: CANON KABUSHIKI KAISHA, Tokyo (JP)

(72) Inventors: Hotaka Kusano, Kanagawa (JP); Sentaro Aihara, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/860,336

(22) Filed: Jul. 8, 2022

(65) Prior Publication Data
US 2023/0036274 A1    Feb. 2, 2023

(30) Foreign Application Priority Data

Jul. 30, 2021  (JP) .................................. 2021-126048
Apr. 15, 2022  (JP) .................................. 2022-067826

(51) Int. Cl.
  B29C 59/02     (2006.01)
  B29C 59/00     (2006.01)
  B29C 37/00     (2006.01)

(52) U.S. Cl.
  CPC .......... B29C 59/002 (2013.01); B29C 59/026 (2013.01); B29C 2037/903 (2013.01)

(58) Field of Classification Search
  CPC ................ B29C 59/002; B29C 59/026; B29C 2037/903
  USPC ...................................................... 264/40.1
  See application file for complete search history.

(56) References Cited

U.S. PATENT DOCUMENTS

| | | |
|---|---|---|
| 8,394,282 B2 | 3/2013 | Panga et al. |
| 9,415,418 B2 | 8/2016 | Sreenivasan et al. |
| 10,303,050 B2 | 5/2019 | Sato |
| 10,514,599 B2 | 12/2019 | Takarada et al. |
| 10,831,098 B2 | 11/2020 | Baba |
| 2013/0279793 A1 | 10/2013 | Toyoda et al. |

(Continued)

FOREIGN PATENT DOCUMENTS

| | | |
|---|---|---|
| CN | 106226992 A | 12/2016 |
| JP | 2014033050 A | 2/2014 |

(Continued)

OTHER PUBLICATIONS

Office Action issued in Taiwanese Appln. No. 111123844 dated Oct. 8, 2024. English translation provided.

*Primary Examiner* — Jeffrey M Wollschlager
*Assistant Examiner* — Xue H Liu
(74) *Attorney, Agent, or Firm* — ROSSI, KIMMS & McDOWELL LLP

(57) ABSTRACT

The present invention provides an information processing apparatus including a processing unit configured to perform a process of outputting information indicating a contact state between a mold and a composition on a substrate, wherein the processing unit obtains a plurality of points representing a contour shape of a portion where the mold and the composition on the substrate are in contact with each other while at least one process of a contact process and a mold releasing process is performed, and outputs the information indicating the contact state based on the plurality of points.

17 Claims, 14 Drawing Sheets

(56) References Cited

U.S. PATENT DOCUMENTS

| | | | |
|---|---|---|---|
| 2016/0046065 A1* | 2/2016 | Takarada | G03F 7/0002 264/494 |
| 2016/0158978 A1* | 6/2016 | Aihara | B29C 59/02 425/149 |
| 2016/0354969 A1 | 12/2016 | Baba et al. | |
| 2020/0200949 A1 | 6/2020 | Yu et al. | |

FOREIGN PATENT DOCUMENTS

| | | | |
|---|---|---|---|
| JP | 2014209231 | A | 11/2014 |
| JP | 2015056589 | A | 3/2015 |
| JP | 2016042501 | A | 3/2016 |
| JP | 2016111335 | A | 6/2016 |
| JP | 2019004055 | A | 1/2019 |
| JP | 2019080047 | A | 5/2019 |
| KR | 1020130064717 | A | 6/2013 |
| KR | 1020190107634 | A | 9/2019 |
| TW | 201630042 | A | 8/2016 |
| TW | 20196711 | A | 2/2019 |

\* cited by examiner

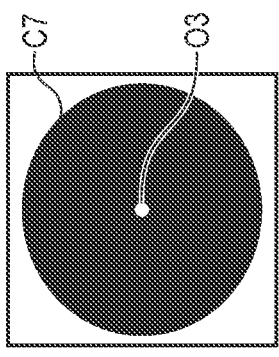
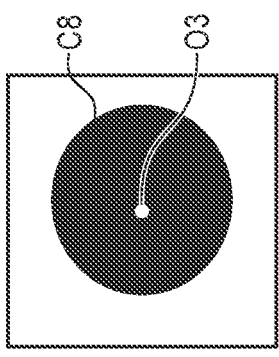
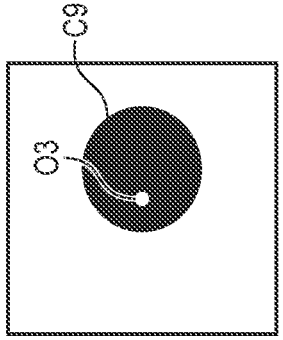
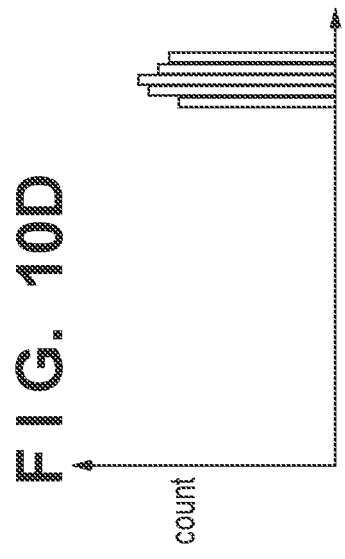
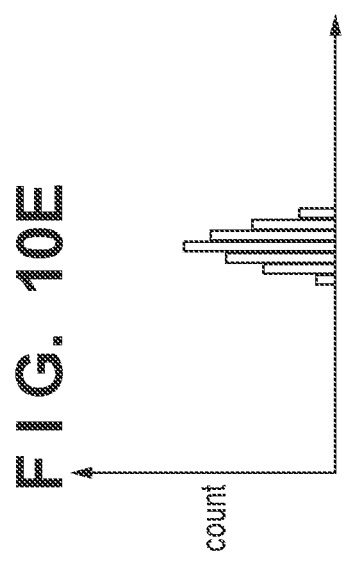
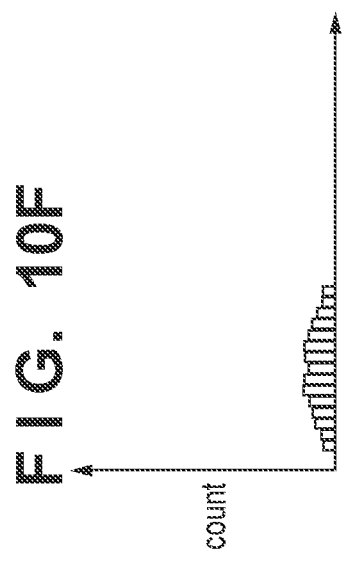
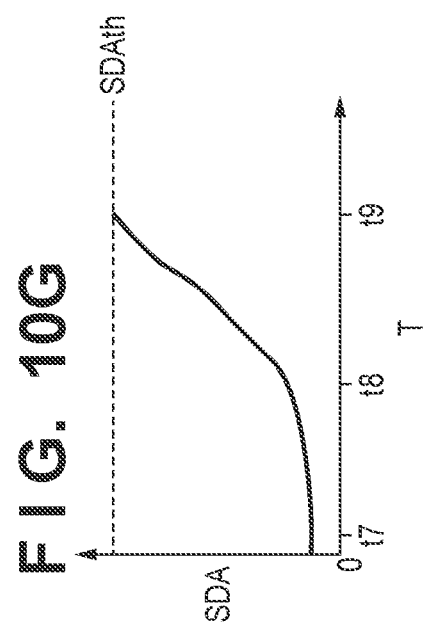

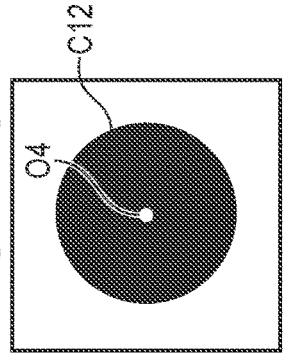
FIG. 15A
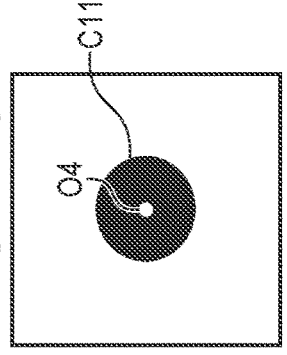
FIG. 15B
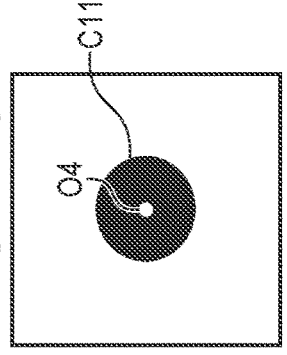
FIG. 15C
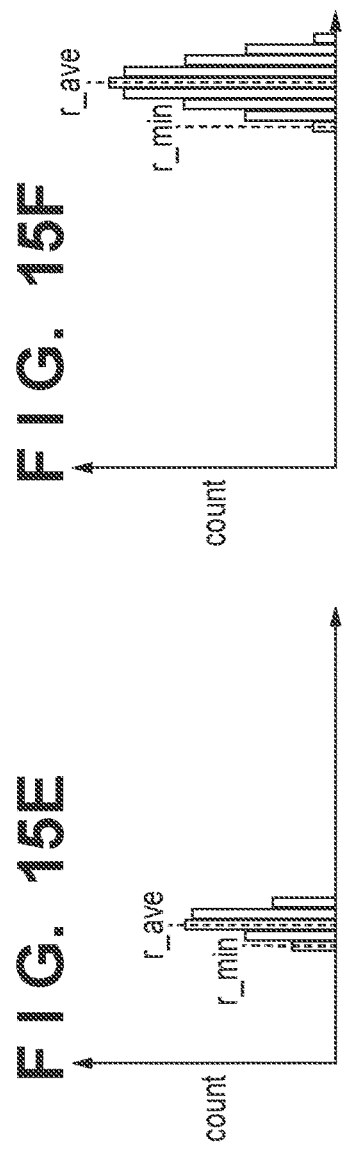
FIG. 15D
FIG. 15E
FIG. 15F
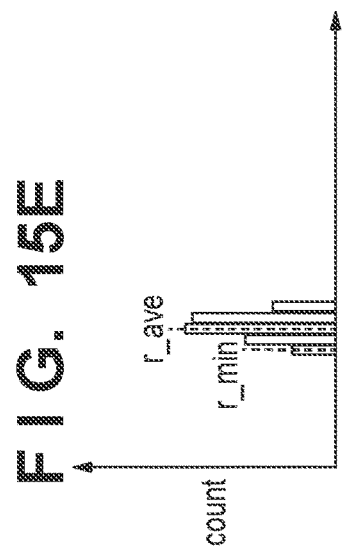
FIG. 15G
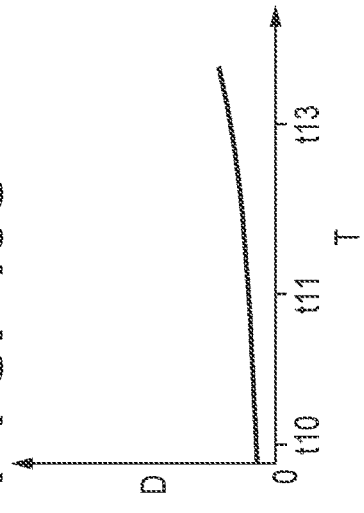
FIG. 15H

INFORMATION PROCESSING APPARATUS, MOLDING APPARATUS, MOLDING METHOD, AND ARTICLE MANUFACTURING METHOD

BACKGROUND OF THE INVENTION

Field of the Invention

The present invention relates to an information processing apparatus, a molding apparatus, a molding method, and an article manufacturing method.

Description of the Related Art

An exposure apparatus that transfers a pattern of an original onto a substrate via a projection optical system is known as a technique for forming a fine pattern on a substrate. Further, as another technique for forming a fine pattern on a substrate, an imprint apparatus using an imprint technique is also being put into practical use.

As disclosed in Japanese Patent Laid-Open No. 2019-80047, the imprint technique includes, as one of imprint material (composition) curing methods, a photocuring method. The photocuring method is a method in which, in a state in which an imprint material arranged (supplied) on a substrate is in contact with a mold, the imprint material is cured by irradiation with light such as ultraviolet light, and the mold is separated from the cured imprint material, thereby forming a pattern of the imprint material on the substrate.

In the imprint apparatus, the mold and the substrate are brought into contact with each other via the imprint material. In a contact process of bringing the mold and the imprint material on the substrate into contact with each other, if a foreign substance adheres to the mold or the substrate, even if the foreign substance is minute, a defect is generated in the pattern formed on the substrate. Further, depending on the kind and size of the foreign substance, the pattern of the mold may be damaged. If the thickness of the substrate is uneven, a force is unevenly applied within a surface in which the mold and the substrate are in contact with each other via the imprint material. This can lead the uneven imprint material between the mold and the substrate, resulting in a defect in the pattern formed on the substrate.

On the other hand, also in a mold releasing process of releasing the mold from the cured imprint material on the substrate, if the thickness of the substrate is uneven, a force is unevenly applied within a surface in which the mold and the substrate are in contact with each other via the imprint material, so that the pattern formed on the substrate may be peeled off.

In this manner, if an abnormality is generated in the imprint process including the contact process and the mold releasing process, it may lead to a defect in the pattern formed on the substrate or a damage of the pattern of the mold. Therefore, it is necessary to check the contact state between the mold and the imprint material on the substrate.

SUMMARY OF THE INVENTION

The present invention provides a technique advantageous in, in a molding process of molding a composition on a substrate using a mold, checking the contact state between the mold and the composition on the substrate.

According to one aspect of the present invention, there is provided an information processing apparatus connected to a molding apparatus that performs a molding process of molding a composition on a substrate using a mold, the molding apparatus including an image capturing unit configured to capture an image by irradiating the substrate with light via the mold, and detecting reflected light from the mold and reflected light from the substrate, the information processing apparatus including a processing unit configured to perform a process of outputting information indicating a contact state between the mold and the composition on the substrate based on the image captured by the image capturing unit, wherein the molding process includes a contact process of bringing the mold and the composition into contact with each other so as to gradually increase a portion where the mold and the composition on the substrate are in contact with each other, and a mold releasing process of separating the mold from the composition so as to gradually decrease the portion, and the processing unit obtains a plurality of points representing a contour shape of the portion from the image captured by the image capturing unit while at least one process of the contact process and the mold releasing process is performed, and outputs the information indicating the contact state based on the plurality of points.

Further aspects of the present invention will become apparent from the following description of exemplary embodiments with reference to the attached drawings.

BRIEF DESCRIPTION OF THE DRAWINGS

FIGS. 10A to 10G are views for describing an abnormality detection process of detecting an abnormality in a mold releasing process.

FIGS. 15A to 15H are views for describing a normal contact process as a comparative example.

DESCRIPTION OF THE EMBODIMENTS

Figure 1A:
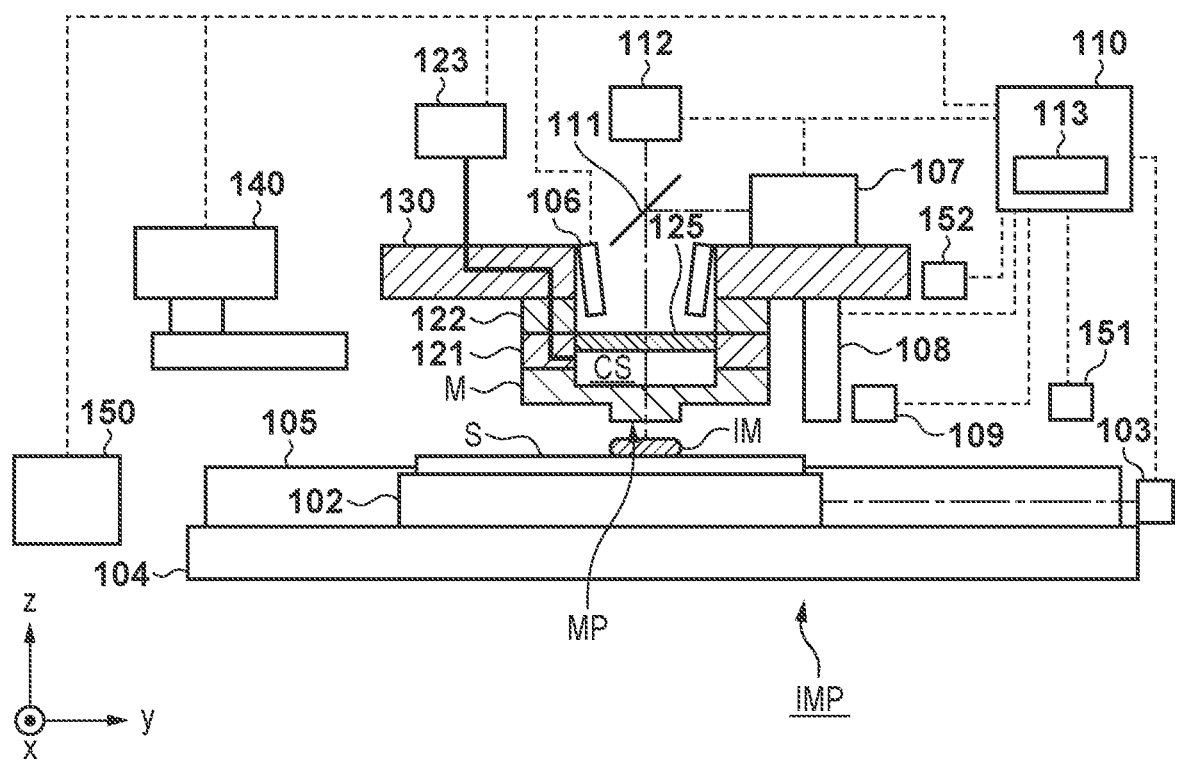
FIGS. 1A and 1B are views for describing configurations of an imprint apparatus as one aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1B:
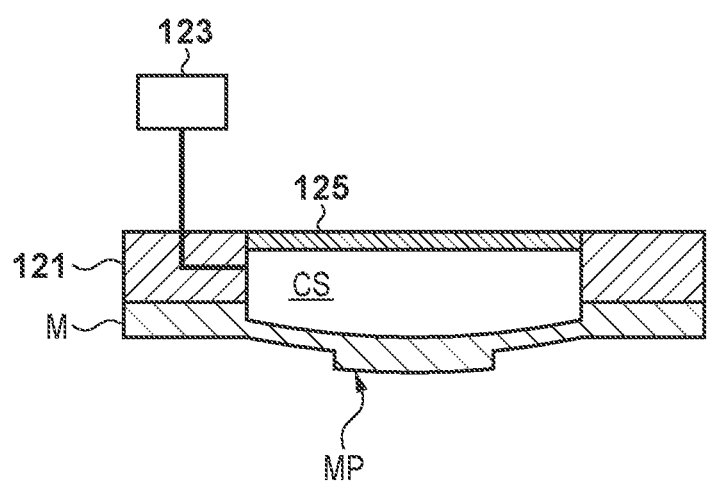

FIGS. 1A and 1B are views for describing configurations of an imprint apparatus IMP as one aspect of the present invention. The imprint apparatus IMP is a lithography apparatus employed in a lithography step that is a manufacturing step for a device such as a semiconductor element, a liquid crystal display element, or magnetic storage medium as an article to form a pattern on a substrate. The imprint apparatus IMP functions as a molding apparatus that molds an imprint material serving as a composition on a substrate using a mold. In this embodiment, the imprint apparatus IMP brings an uncured imprint material arranged (supplied) on a substrate into contact with a mold, and applies curing energy to the imprint material, thereby forming a pattern of a cured product to which the pattern of the mold is transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In the specification and the accompanying drawings, directions will be indicated on an XYZ coordinate system in which directions parallel to the surface of a substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that is specified based on coordinates on the X-, Y-, and Z-axes, and an orientation is information that is specified by values on the θX-, θY-, and θZ-axes. Positioning means controlling the position and/or orientation. Alignment includes controlling the position and/or orientation of at least one of the substrate and the mold.

The imprint apparatus IMP includes a substrate holding unit 102 that holds a substrate S, a substrate driving mechanism 105 that drives the substrate S by driving the substrate holding unit 102, a base 104 that supports the substrate holding unit 102, and a position measurement unit 103 that measures the position of the substrate holding unit 102. The substrate driving mechanism 105 includes, for example, a motor such as a linear motor. The imprint apparatus IMP also includes a sensor 151 that detects a substrate driving force (alignment load) required for the substrate driving mechanism 105 to drive the substrate S (substrate holding unit 102) in alignment.

The imprint apparatus IMP includes a mold holding unit 121 that holds a mold M, a mold driving mechanism 122 that drives the mold M by driving the mold holding unit 121, and a support structure 130 that supports the mold driving mechanism 122. The mold driving mechanism 122 includes, for example, a motor such as a voice coil motor. The imprint apparatus IMP also includes a sensor 152 that detects the mold releasing force (separation load) and/or the pressing force. The mold releasing force is a force required to release the mold M from a cured product of an imprint material IM on the substrate S. The pressing force is a force with which the mold M is pressed to bring the mold M into contact with the imprint material IM on the substrate S.

The substrate driving mechanism 105 and the mold driving mechanism 122 form a driving mechanism that adjusts the relative position and relative orientation between the substrate S and the mold M. Adjustment of the relative position between the substrate S and the mold M by the driving mechanism includes driving to bring the mold M into contact with the imprint material IM on the substrate S and driving to release the mold M from the cured imprint material IM (a pattern of the cured product) on the substrate S. The substrate driving mechanism 105 is configured to drive the substrate S with respect to a plurality of axes, for example, three axes including the X-axis, Y-axis, and θZ-axis, and preferably six axes including the X-axis, Y-axis, Z-axis, θX-axis, θY-axis, and θZ-axis. The mold driving mechanism 122 is configured to drive the mold M with respect to a plurality of axes, for example, three axes including the Z-axis, θX-axis, and θY-axis, and preferably six axes including the X-axis, Y-axis, Z-axis, θX-axis, θY-axis, and θZ-axis.

The imprint apparatus IMP includes a mold conveyance mechanism 140 that conveys the mold M, and a mold cleaner 150. For example, the mold conveyance mechanism 140 conveys the mold M to the mold holding unit 121, or conveys the mold M from the mold holding unit 121 to a stocker (not shown), the mold cleaner 150, or the like. The mold cleaner 150 cleans the mold M using ultraviolet light, a chemical solution, or the like.

The mold holding unit 121 includes a window member 125 that forms a pressure control space CS on the side of the back surface (the surface on the opposite side of a pattern surface MP on which the pattern to be transferred to the substrate S has been formed) of the mold M. The imprint apparatus IMP includes a deforming mechanism 123 that deforms the pattern surface MP of the mold M into a convex shape toward the substrate S as schematically shown in FIG. 1B by controlling the pressure (to be referred to as the "cavity pressure" hereinafter) in the pressure control space CS.

The imprint apparatus IMP also includes an alignment measurement unit 106, a wide-angle alignment measurement unit 109, a curing unit 107, an image capturing unit 112, and an optical member 111. The alignment measurement unit 106 illuminates an alignment mark provided in the mold M and an alignment mark provided in the substrate S and captures the images of the marks, thereby measuring the relative position between the marks. The alignment measurement unit 106 is positioned via a driving mechanism (not shown) in accordance with the positions of the alignment marks provided in the mold M and the substrate S. The wide-angle alignment measurement unit 109 has a wider field of view than the alignment measurement unit 106. The wide-angle alignment measurement unit 109 illuminates the alignment mark provided in the substrate S and captures the image of the alignment mark, thereby measuring the position of the substrate S. By measuring the position of the substrate S using the wide-angle alignment measurement unit 109, it is possible to position the alignment mark provided in the substrate S within the field of view of the alignment measurement unit 106.

The curing unit 107 irradiates the imprint material IM on the substrate S with energy for curing the imprint material IM, for example, light such as ultraviolet light via the optical member 111, thereby curing the imprint material IM.

The image capturing unit 112 captures the mold M, the imprint material IM on the substrate S, and the substrate S via the optical member 111 and the window member 125. In this embodiment, the image capturing unit 112 captures an image by irradiating the substrate S with light via the mold M and detecting reflected light from the mold M and reflected light from the substrate S. The image (including a moving image) acquired by the image capturing unit 112 is referred to as a "spread image" hereinafter.

The imprint apparatus IMP includes a dispenser 108 that arranges the imprint material IM on the substrate S. The dispenser 108 discharges the imprint material IM (droplets thereof) to the substrate S in accordance with, for example, a drop recipe indicating the arrangement of the imprint material IM (droplets) on the substrate.

The imprint apparatus IMP includes a control unit 110 that performs an imprint process by comprehensively controlling the respective units of the imprint apparatus IMP. The control unit 110 controls the substrate driving mechanism 105, the mold driving mechanism 122, the deforming mechanism 123, the mold conveyance mechanism 140, the mold cleaner 150, the alignment measurement unit 106, the wide-angle alignment measurement unit 109, the curing unit 107, the image capturing unit 112, the dispenser 108, and the like. The control unit 110 includes a processing unit 113 that includes an information processing apparatus. The control unit 110 is formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose computer installed with a program, or a combination of all or some of these components.

Figure 2:
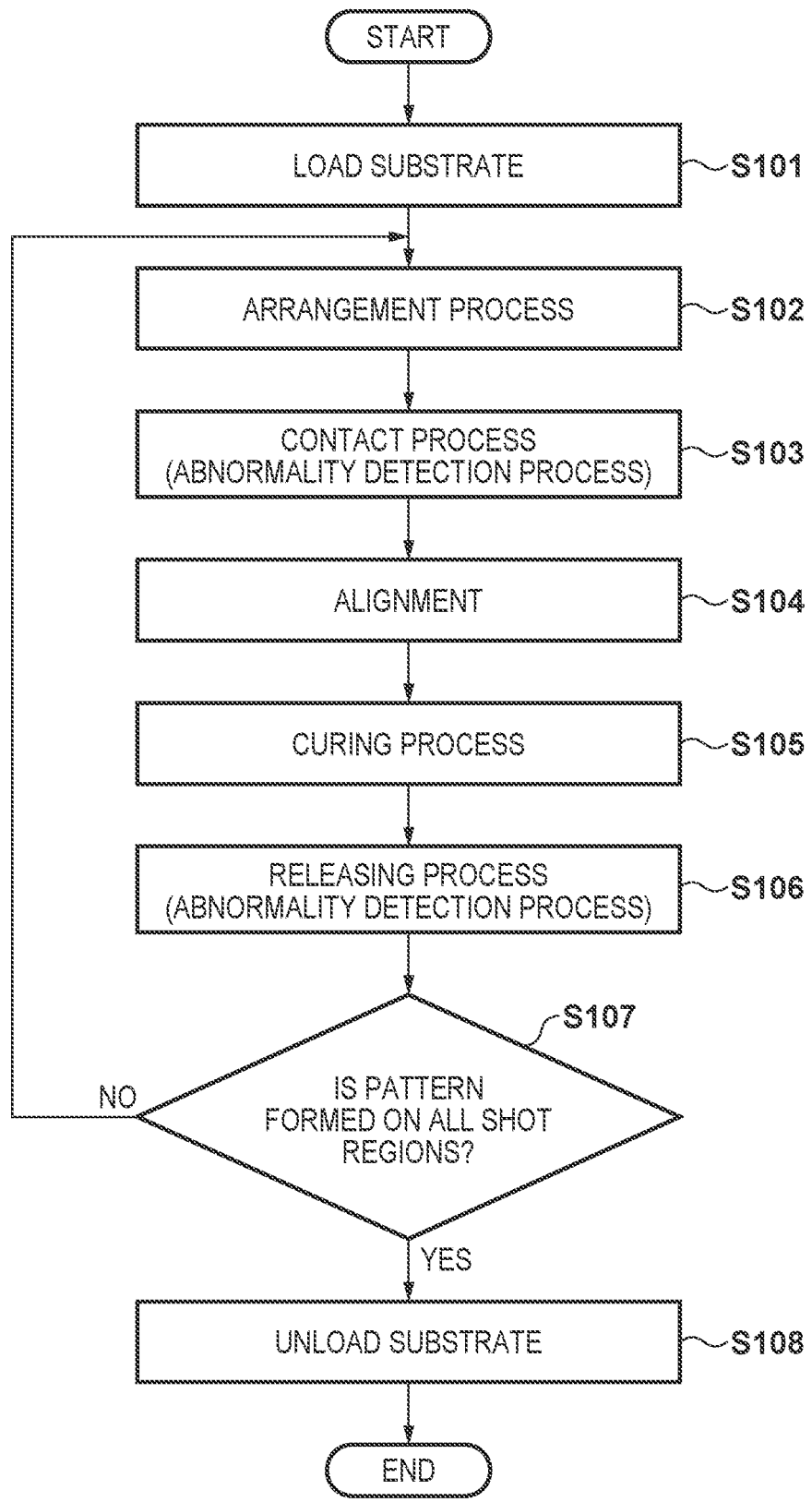
FIG. 2 is a flowchart for describing an operation (imprint process) of the imprint apparatus shown in FIG. 1A.

With reference to FIG. 2, an operation of the imprint apparatus IMP, that is, an imprint process performed by the imprint apparatus IMP will be described below. The imprint process is performed by the control unit 110 comprehensively controlling the respective units of the imprint apparatus IMP as has been described above.

In this embodiment, in the imprint process, more specifically, during at least one process of the contact process and the mold releasing process, a process (abnormality detection process) of detecting an abnormality in the imprint process (the contact process or the mold releasing process) is performed. Then, if an abnormality in the imprint process is detected in the abnormality detection process, for example, the imprint process is stopped, thereby suppressing (preventing) generation of a defect in a pattern formed on the substrate S and a damage of the pattern of the mold M.

In step S101, the substrate S is loaded to the imprint apparatus IMP. More specifically, the substrate S is conveyed, by a substrate conveyance mechanism (not shown), from a conveyance source, for example, a relay part with a preprocessing apparatus to the substrate holding unit 102 serving as a conveyance destination. At this time, by using a foreign substance detector (not shown), foreign substance detection (inspection) may be performed for the substrate S loaded to the imprint apparatus IMP. Further, an alignment mark provided in the substrate S conveyed to the substrate holding unit 102 is detected by the wide-angle alignment measurement unit 109 to measure the position of the substrate S in the substrate holding unit 102. Based on the position of the substrate S measured by the wide-angle alignment measurement unit 109, the substrate S held by the substrate holding unit 102 is positioned.

In steps from S102 to S106, each process for forming the pattern on the substrate is performed on, among a plurality of shot regions (section regions in each of which a pattern is to be formed) of the substrate S, a shot region (target shot region) serving as a target of the imprint process.

In step S102, an arrangement process of arranging (supplying) the imprint material IM on the target shot region of the substrate S is performed. More specifically, the substrate S held by the substrate holding unit 102 is positioned below the dispenser 108. Then, the imprint material IM (droplets thereof) is discharged from the dispenser 108 to the substrate S while driving the substrate S by the substrate driving mechanism 105 to arrange the imprint material IM on the target shot region of the substrate S.

In step S103, a contact process (pressing process) of bringing the imprint material IM on the target shot region of the substrate and the mold M (pattern surface MP) into contact with each other is performed. For example, at least one of the mold driving mechanism 122 and the substrate driving mechanism 105 relatively drives the mold M and the substrate S so as to bring the pattern surface MP of the mold M into contact with the imprint material IM on the target shot region of the substrate S. In this embodiment, the mold driving mechanism 122 drives the mold M so as to bring the pattern surface MP of the mold M into contact with the imprint material IM on the target shot region of the substrate S. At this time, the pattern surface MP of the mold M is deformed into a convex shape toward the substrate S by the deforming mechanism 123, and the mold M and the imprint material IM are brought into contact with each other so as to gradually increase a portion where the mold M and the imprint material IM on the target shot region of the substrate S are in contact with each other.

Further, in the contact process, the image capturing unit 112 continuously captures images of the mold M, the imprint material IM, and the substrate S to acquire a plurality of spread images. At this time, as will be described later, an interference fringe (interference pattern) formed by reflected light from the mold M and reflected light from the substrate S is observed by the image capturing unit 112. The interference fringe changes as the contact of the pattern surface MP of the mold M with the imprint material IM on the target shot region of the substrate S progresses. In the contact process, using the spread images each including the interference fringe as described above, an abnormality detection process of detecting an abnormality in the imprint process, that is, an abnormality in the contact process is also performed in parallel. The abnormality detection process will be described later in detail. Note that in the abnormality detection process, if an abnormality in the contact process is detected, the relative driving between the mold M and the substrate S by at least one of the mold driving mechanism 122 and the substrate driving mechanism 105 is stopped to stop the contact process (imprint process). Then, in accordance with a user instruction, for example, the substrate S is unloaded from the imprint apparatus IMP.

In step S104, alignment between the target shot region of the substrate S and the pattern surface MP of the mold M is performed. In the alignment, while measuring the relative position between the alignment mark in the target shot region of the substrate S and the alignment mark in the mold M by the alignment measurement unit 106, the relative position is brought into an allowable range of a target relative position. In the alignment, at least one of the mold driving mechanism 122 and the substrate driving mechanism 105 relatively drives the mold M and the substrate S. The target relative position between the alignment mark in the target shot region of the substrate S and the alignment mark in the mold M is decided, for example, by a correction value obtained from a past inspection result of an overlay inspection apparatus.

In step S105, in a state in which the imprint material IM on the target shot region of the substrate S and the pattern surface MP of the mold M are in contact with each other, a curing process of curing the imprint material IM is performed. More specifically, energy for curing the imprint material IM on the target shot region of the substrate S is applied from the curing unit 107 to the imprint material IM between the substrate S and the pattern surface MP of the mold M. With this, the imprint material IM between the substrate S and the pattern surface MP of the mold M is cured, and a cured product of the imprint material IM is formed.

In step S106, a mold releasing process of releasing the mold M (pattern surface MP) from the cured imprint material IM on the target shot region of the substrate S is performed. For example, at least one of the mold driving mechanism 122 and the substrate driving mechanism 105 relatively drives the mold M and the substrate S so as to separate the imprint material IM on the target shot region of the substrate S and the pattern surface MP of the mold M from each other. In this embodiment, the mold driving mechanism 122 drives the mold M so as to separate the imprint material IM on the target shot region of the substrate S and the pattern surface MP of the mold M from each other. At this time, the mold M is released from the imprint material IM while deforming the pattern surface MP of the mold M into a convex shape toward the substrate S by the deforming mechanism 123 so as to gradually decrease the portion where the mold M and the imprint material IM on the target shot region of the substrate S are in contact with each other.

Also in the mold releasing process, as in the contact process, the image capturing unit 112 continuously captures images of the mold M, the imprint material IM, and the substrate S to acquire a plurality of spread images. At this time, as will be described later, an interference fringe (interference pattern) formed by reflected light from the mold M and reflected light from the substrate S is observed by the image capturing unit 112. The interference fringe changes as the pattern surface MP of the mold M is released from the imprint material IM on the target shot region of the substrate S. In the mold releasing process, using the spread images each including the interference fringe as described above, an abnormality detection process of detecting an abnormality in the imprint process, that is, an abnormality in the mold releasing process is also performed in parallel. Note that in the abnormality detection process, if an abnormality in the mold releasing process is detected, the relative driving between the mold M and the substrate S by at least one of the mold driving mechanism 122 or the substrate driving mechanism 105 is stopped to stop the mold releasing process (imprint process). Then, in accordance with a user instruction, for example, after the pattern surface MP of the mold M is slowly released from the imprint material IM on the target shot region of the substrate S, the substrate S is unloaded from the imprint apparatus IMP.

In step S107, it is determined whether the pattern has been formed, that is, whether the respective processes (from step S102 to step S106) for forming the pattern of the substrate have been performed on all the shot regions of the substrate S. If the respective processes for forming a pattern on the substrate have been performed on all shot regions of the substrate S, the process transitions to step S108. On the other hand, if the respective processes for forming the pattern on the substrate have not been performed on all the shot regions of the substrate S, the process transitions to step S102. Then, an unprocessed (the pattern has not been formed) shot region of the substrate S is selected as the target shot region, and the respective processes (from step S102 to step S106) for forming the pattern on the substrate are performed.

In step S108, the substrate S is unloaded from the imprint apparatus IMP. More specifically, the substrate conveyance mechanism (not shown) conveys the substrate S from the substrate holding unit 102 serving as a conveyance source to a conveyance destination, for example, a relay part with a post-processing apparatus.

Note that when the imprint apparatus IMP performs the process on a lot basis, each lot being formed by a plurality of substrates, the imprint process illustrated in FIG. 2 is performed on each of the plurality of substrates forming the lot.

Next, the interference fringe observed by the image capturing unit 112 in each of the contact process and the mold releasing process will be described. FIGS. 3A to 3H are views for describing the interference fringe observed by the image capturing unit 112 in a state in which the pattern surface MP of the mold M is deformed into a convex shape toward the substrate S, that is, in the contact process of bringing the mold M in a curved state into contact with the imprint material IM. Here, a case will be described in which no foreign substance or the like exists (is sandwiched) between the pattern surface MP of the mold M and the substrate S.

Figure 3A:
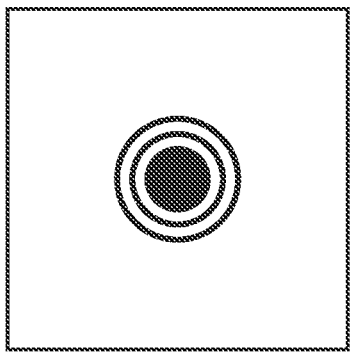
FIGS. 3A to 3H are views for describing an interference fringe observed by an image capturing unit of the imprint apparatus shown in FIG. 1A.
Figure 3E:
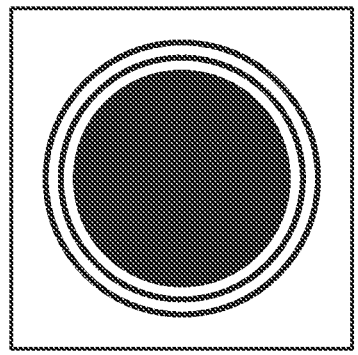
Figure 3B:
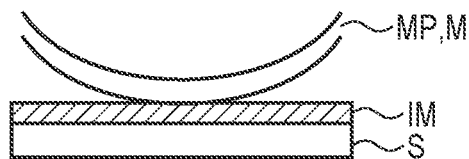
Figure 3F:
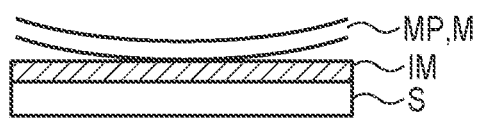
Figure 3C:
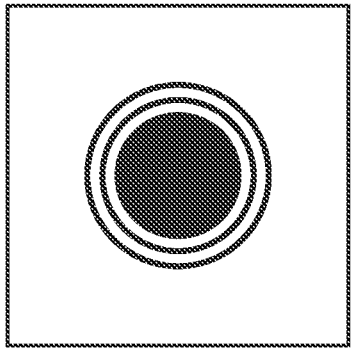
Figure 3G:
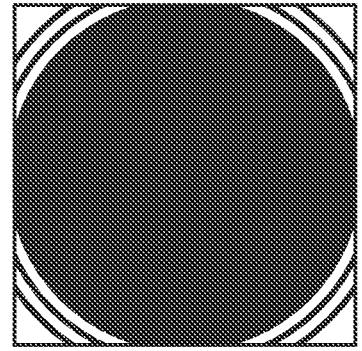
Figure 3D:
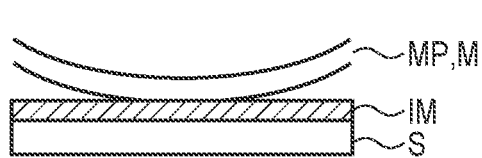

Each of FIGS. 3A, 3C, and 3E shows the interference fringe observed by the image capturing unit 112 in a state in which the pattern surface MP of the mold M is in contact with the imprint material IM, that is, a spread image including the interference fringe. Each of FIGS. 3B, 3D, and 3F shows the sections of the pattern surface MP of the mold M and the substrate S at the time when the image capturing unit 112 has acquired the spread image shown in each of FIGS. 3A, 3C, and 3E, respectively.

FIG. 3A shows the spread image acquired in the early stage of the contact process of bringing the mold M in a curved state into contact with the imprint material IM. In the early stage of the contact process, as shown in FIG. 3B, the top of the pattern surface MP having a convex shape is in contact with the imprint material IM. Therefore, in the spread image acquired by the image capturing unit 112, an interference fringe caused by light interference is observed around the portion (the black contact region in the center) where the pattern surface MP of the mold M and the imprint material IM are in contact with each other.

Each of FIGS. 3C and 3E shows the spread image acquired in a middle stage of the contact process in which, after bringing the pattern surface MP of the mold M and the imprint material IM into contact with each other, the curvature of the mold M is gradually returned to a flat surface. In the middle stage of the contact process, as shown in each of FIGS. 3D and 3F, the contact region (area thereof) between the pattern surface MP of the mold M and the imprint material IM gradually increases by returning the curvature of the mold M into a flat surface. Therefore, in the spread image acquired by the image capturing unit 112, it is observed that the contact region between the pattern surface MP of the mold M and the imprint material IM evenly (concentrically) spreads from the center of the pattern surface MP toward the periphery (outer periphery). The interference fringe observed around the contact region between the pattern surface MP of the mold M and the imprint material IM also spreads.

Figure 3H:
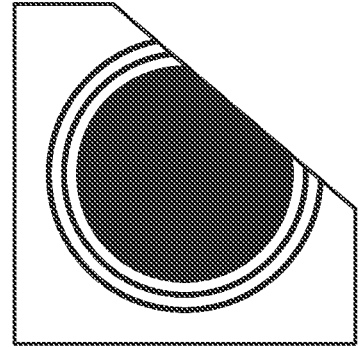

The interference fringe is formed due to interference between the reflected light from the mold M, more specifically, the light reflected on the surface of the pattern surface MP, and the reflected light from the substrate S, more specifically, the light reflected on the surface of the substrate S. In the later stage of the contact process, the pattern surface MP of the mold M is in contact with the imprint material IM in the entire surface of the shot region of the substrate S. Therefore, no interference fringe is observed. This is because, since there is almost no difference in refractive index between the pattern surface MP of the mold M and the imprint material IM, when the pattern surface MP and the imprint material IM are in contact with each other, light is not reflected on the pattern surface MP so no interference fringe is formed. For example, immediately before the completion of the contact process, the spread image shown in FIG. 3G is acquired by the image capturing unit 112. For a shot region (partial shot region) in contact with the outer periphery of the substrate S, the spread image shown in FIG. 3H is acquired by the image capturing unit 112.

The interference fringes (spread images shown in FIGS. 3A, 3C, 3E, 3G, and 3H) as described above are also observed during the mold releasing process. However, in the mold releasing process, the interference fringes are observed in the reverse order of the contact process.

Figure 4:
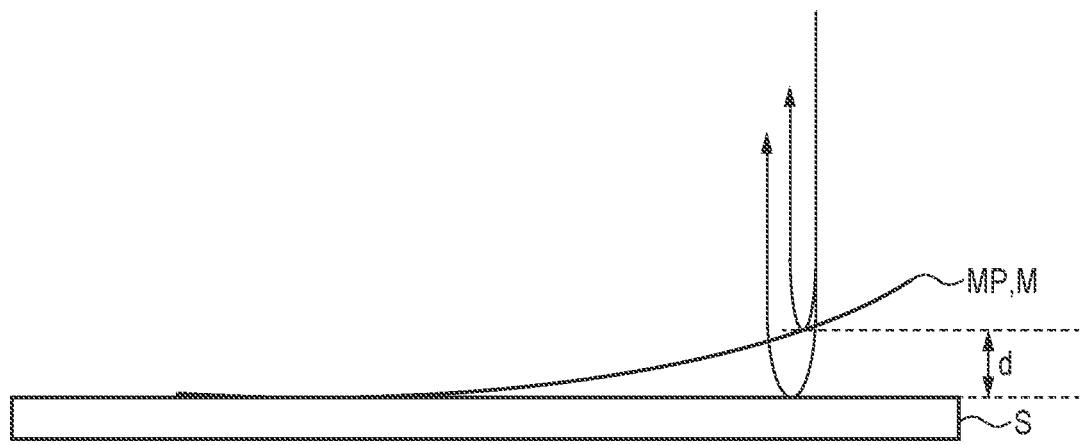
FIG. 4 is a view for describing a phenomenon in which an interference fringe is observed around a contact region between a pattern surface of a mold and an imprint material.

With reference to FIG. 4, a phenomenon in which the interference fringe caused by light interference is observed around the contact region between the pattern surface MP of the mold M and the imprint material IM will be described. When the mold M is curved with respect to the substrate S and brought into contact with the imprint material IM, the light applied from the image capturing unit 112 to the mold M and the substrate S is reflected on the surface of the substrate S, and reflected also on the pattern surface MP (the surface facing the substrate S) of the mold M. Accordingly, as shown in FIG. 4, due to the optical path difference ($2d$) between the mold M and the substrate S, the reflected light from the mold M and the reflected light from the substrate S interfere each other, and an interference fringe is formed.

On the other hand, in the portion where the pattern surface MP of the mold M and the imprint material IM are in contact with each other, the imprint material IM exists between the pattern surface MP and the substrate S. As has been described above, there is almost no difference in refractive index between the pattern surface MP of the mold M and the imprint material IM. Therefore, in the portion where the pattern surface MP of the mold M and the imprint material IM are in contact with each other, the light is not reflected on the pattern surface MP. Accordingly, in the portion (contact region) where the pattern surface MP of the mold M and the imprint material IM are in contact with each other, no interference fringe is formed but, around the portion, a light-dark ring pattern similar to Newton's ring in which several light and dark rings are concentrically repeated, that is, an interference fringe (a plurality of light and dark fringes) is formed. In this embodiment, by using such the interference fringe, the contact state between the mold M and the imprint material IM on the substrate S is observed.

Figure 5A:
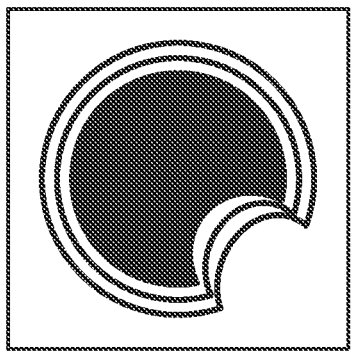
FIGS. 5A to 5D are views for describing examples of a contact state between the mold and the imprint material.
Figure 5B:
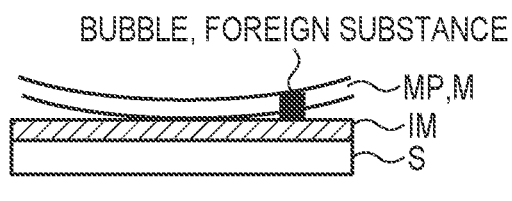
Figure 5C:
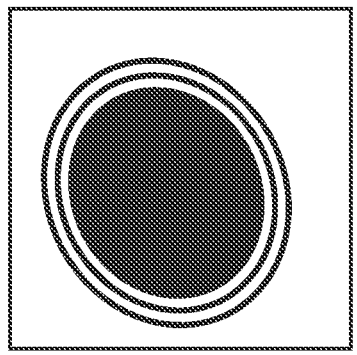
Figure 5D:

With reference to FIGS. 5A to 5D, examples of the contact state between the pattern surface MP of the mold M and the imprint material IM on the substrate S in the contact process will be described. Each of FIGS. 5A and 5C shows a spread image acquired by the image capturing unit 112 in the contact process of bringing the mold M in a curved state into contact with the imprint material IM. Each of FIGS. 5B and 5D shows the sections of the pattern surface MP of the mold M and the substrate S at the time when the image capturing unit 112 has acquired the spread image shown in each of FIGS. 5A and 5C, respectively. FIGS. 5A to 5D show examples of the contact state different from the normal contact state between the pattern surface MP of the mold M and the imprint material IM as shown in FIGS. 3A to 3H. More specifically, examples are shown in which the contact region and a part of the interference fringe formed around the contact region observed when the pattern surface MP of the mold M and the imprint material IM are in contact with each other have shapes deviated from a circle.

FIGS. 5A and 5B show a spread image and sections, respectively, in a case in which a bubble, a foreign substance (particle), or the like is considered to exist between the mold M and the substrate S. The spacing d (FIG. 4) between the mold M and the substrate S continuously changes in accordance with the deformation amount (inclination) of the mold M. Thus, the contact region between the pattern surface MP of the mold M and the imprint material IM and the interference fringe around the contact region concentrically spread from the center of the shot region toward the periphery as shown in FIGS. 3A, 3C, 3E, and 3G. On the other hand, if a bubble, a foreign substance, or the like exists between the mold M and the substrate S, the bubble, the foreign substance, or the like hiders spreading of the imprint material IM, so the interference fringe does not become concentric as shown in FIG. 5A.

FIGS. 5C and 5D show a spread image and sections, respectively, in a case in which the contact region between the pattern surface MP of the mold M and the imprint material IM is considered to spread in respective directions at different speeds. A gas that exists in a space where the pattern surface MP of the mold M and the imprint material IM are in contact with each other escapes to the outside as the contact region spreads, but if the thickness of the substrate S is uneven, the gas may escape differently in the respective directions. In this case, the spread image as shown in FIG. 5C is acquired. Note that the interference fringe as shown in each of FIGS. 5A and 5C is also observed during the mold releasing process.

Figure 6A:
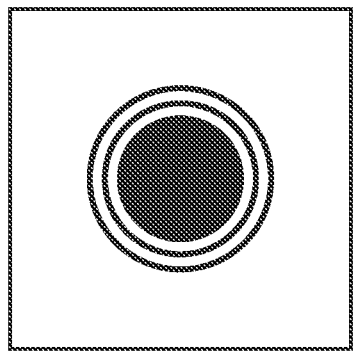
FIGS. 6A to 6D are views for describing examples of the contact state between the mold and the imprint material.
Figure 6B:
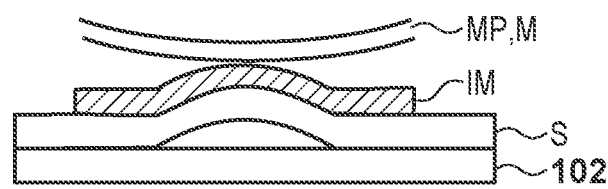
Figure 6C:
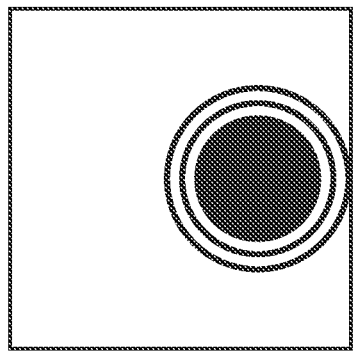
Figure 6D:
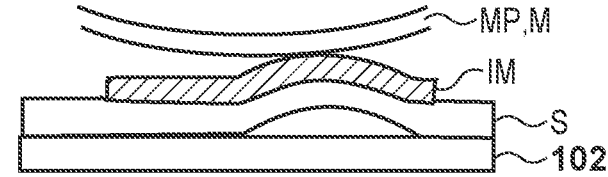

With reference to FIGS. 6A to 6D, examples of the contact state between the pattern surface MP of the mold M and the imprint material IM on the substrate S in the mold releasing process will be described. Each of FIGS. 6A and 6C shows a spread image acquired by the image capturing unit 112 in the mold releasing process of releasing the mold M in a curved state from the imprint material IM on the substrate S. Each of FIGS. 6B and 6D shows the sections of the pattern surface MP of the mold M and the substrate S at the time when the image capturing unit 112 has acquired the spread image shown in each of FIGS. 6A and 6C, respectively.

FIGS. 6A and 6B show a spread image and sections, respectively, in a case in which the mold releasing process is normally performed. In the substrate holding unit 102, the chucking pressure upon holding the substrate S can be changed for each region of the holding surface holding the substrate S. For example, in the mold releasing process, by partially decreasing the chucking pressure of the substrate S by the substrate holding unit 102, the substrate S and the imprint material IM are deformed (bended) into a convex shape toward the mold M (pattern surface MP thereof) as shown in FIG. 6B. With this, it becomes possible to decrease the force (gravity) which the imprint material IM on the substrate S receives from the mold M, and correctly release the mold M from the imprint material IM on the substrate S. If the mold releasing process is normally performed, the substrate holding unit 102 (the chucking pressure with respect to the substrate S) is controlled so as to chuck the region of the substrate S corresponding to the outside of the pattern surface MP of the mold M, but so as not to chuck the region of the substrate S corresponding to the inside of the pattern surface MP. Therefore, also in the spread image shown in FIG. 6A, a concentric interference fringe is observed.

FIGS. 6C and 6D show a spread image and sections, respectively, in a case in which the mold releasing process is not normally performed (an abnormality is generated in the mold releasing process). In the substrate holding unit 102, if the chucking pressure with respect to the substrate S is incorrectly controlled, the portion where the substrate S and the imprint material IM are deformed into a convex shape toward the mold M is deviated from the center of the pattern surface MP of the mold M as shown in FIG. 6D. In this state, the force which the imprint material IM on the substrate S receives from the mold M cannot be decreased, so the imprint material IM on the substrate S does not separate from the mold M. As a result, the pattern of the imprint material IM cannot be formed on the substrate S. In the spread image shown in FIG. 6C, a concentric interference fringe is observed at a position deviated from the center of the pattern surface MP of the mold M.

Therefore, in this embodiment, as has been described above, during at least one process of the contact process and the mold releasing process, the abnormality detection process of detecting an abnormality in the imprint process is performed using the spread image including the interference fringe. Similar to the imprint process, the abnormality detection process is performed by the control unit 110 (processing unit 113) comprehensively controlling the respective units of the imprint apparatus IMP.

In the abnormality detection process, first, from the spread image acquired by the image capturing unit 112 while each of the contact process and the mold releasing process is performed, a contour shape including the portion where the mold M and the imprint material IM on the substrate S are in contact with each other is extracted, and a plurality of points (point group) representing the contour shape are obtained. Note that the image capturing unit 112 acquires a plurality of spread images in time series while each of the contact process and the mold releasing process is performed, and the control unit 110 obtains, for each of the plurality of spread images, a point group representing the contour shape including the portion where the mold M and the imprint material IM are in contact with each other. Then, based on the point group representing the contour shape, an abnormality in the imprint process, that is, an abnormality in the contact process or an abnormality in the mold releasing process is detected. For example, for each of the plurality of spread images, statistical processing is performed for the point group obtained from each spread image. By using the statistic value obtained in the statistical processing, the state as shown in each of FIGS. 5A, 5C, and 6C can be detected as an abnormality. The statistic value used for the abnormality detection process includes, for example, at least one of a maximum value, a minimum value, an average value, an intermediate value (median value), and a standard deviation.

Figure 7A:
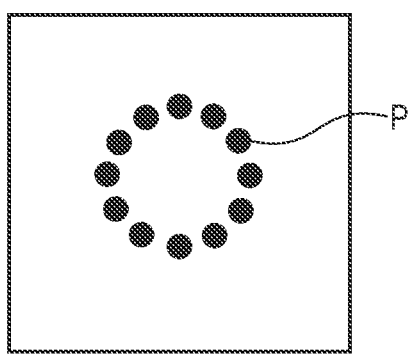
FIGS. 7A and 7B are views for describing an abnormality detection process of detecting an abnormality in the imprint process.
Figure 7B:
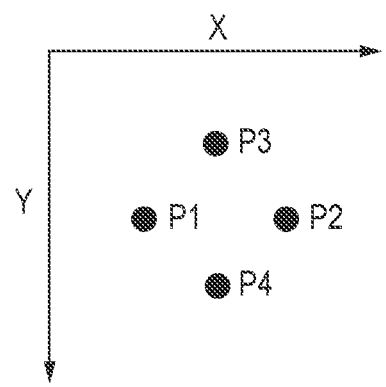

With reference to FIGS. 7A and 7B, an example of a method of obtaining, from a spread image, a point group representing the contour shape including the portion where the mold M and the imprint material IM are in contact with each other, and an example of a statistic value obtained by performing statistical processing for the point group representing the contour shape will be described.

FIG. 7A shows the contour shape of the portion where the mold M and the imprint material IM are in contact with each other in a spread image, that is, a point group P representing the contour shape of the contact region between the mold M and the imprint material IM. The point group P is a group formed by a plurality of points obtained by extracting the contour shape of the contact region, and each point has coordinate information (position information). The point group P can be obtained by, for example, performing a contour tracking process with respect to the spread image. The contour tracking process is image processing for tracking the boundary line of a connection region.

In the contour tracking process, for eight pixels (neighboring pixels) around a boundary pixel (center pixel) as the center, a pixel having the same luminance value as the luminance value of the boundary pixel is searched for, and the found pixel is set to be the next boundary pixel. By repeating the process as described above, a group of the boundary pixels can be extracted. In this embodiment, the group of the boundary pixels obtained by the contour tracking process is defined as the point group P.

Note that with respect to the spread image, image processing such as contrast adjustment or noise removal may be performed before performing the contour tracking process. By performing the contour tracking process on the spread image having undergone the image processing as described above, the contour shape of the contact region between the mold M and the imprint material IM can be extracted with higher accuracy. For example, by obtaining the difference between the spread image (input image) serving as the target of the contour tracking process and the spread image acquired before the start of the contact process or the mold releasing process or after the end thereof, it is possible to remove the fixed pattern noise included in the spread image. Further, by using a median filter or a mean filter, the random noise can also be removed from the spread image. When binarization processing is performed on the spread image with the fixed pattern noise or random noise removed therefrom, and the contour tracking process is performed on the binarized image, the contour shape of the contact region between the mold M and the imprint material IM can be extracted with high accuracy.

With the contact region where the mold M and the imprint material IM are in contact with each other as the starting point, a plurality of interference fringes are generated toward the periphery of the shot region. From the plurality of interference fringes, the boundary used to obtain the point group P can be selected (switched) in accordance with an application. For example, when the state of the contact region between the mold M and the imprint material IM is to be grasped, in place of the contour shape of the contact region between the mold M and the imprint material IM, the point group P representing the contour shape of the innermost interference fringe (that is, the fringe closest to the contact region) among the plurality of interference fringes may be obtained.

Next, the coordinates of a center point O of the contact region (contour shape thereof) between the mold M and the imprint material IM are obtained. The coordinates of the center point O can be obtained from the coordinate information of each point included in the point group P. FIG. 7B shows, of the point group P shown in FIG. 7A, a point P1 having the smallest X coordinate value, a point P2 having the largest X coordinate value, a point P3 having the smallest Y coordinate value, and a point P4 having the largest Y coordinate value. The coordinates of the respective points are defined as P1($x1$, y1), P2($x2$, y2), P3($x3$, y3), and P4($x4$, y4). In this case, the coordinates (Ox, Oy) of the center point O can be obtained from Ox=(x1+x2)/2 and Oy=(y3+y4)/2, or from Ox=(x3+x4)/2 and Oy=(y1+y2)/2.

Note that the coordinates of the center point O are only required to be obtained when the contact region (or interference fringe) between the mold M and the imprint material IM is first extracted (detected) in the plurality of spread images continuous in time series. Accordingly, in the plurality of spread images continuous in time series, the coordinates of the center point O of the first extracted contact region between the mold M and the imprint material IM are used.

Next, the distances from the center point O to the respective points included in the point group P (distances from the center point O to the respective points forming the point group P) are obtained as radii R1, R2, . . . , Rn, and a group thereof is defined as a radius list R={R1, R2, . . . , Rn}. A statistic value of the radii is obtained with the radius list R as a sample, and an abnormality in the imprint process is detected based on the statistic value.

In this embodiment, the center point O is used as a reference point when obtaining the statistic value, but the present invention is not limited to this. A point within the contour shape of the contact region between the mold M and the imprint material IM may be used as the reference point.

With reference to FIGS. 8A to 8G, a method of detecting, as an abnormality (an abnormality in the contact process), a state (FIG. 5A) in which a foreign substance (or bubble) exists between the mold M and the substrate S in the abnormality detection process performed in parallel with the contact process will be described. The elapse time from the start of the contact process to the detection of the abnormality is indicated by times t1, t2, and t3. Assume that the contact region (interference fringe) between the mold M and the imprint material IM spreads in accordance with the elapse time, and reaches the foreign substance at time t3.

Figure 8A:
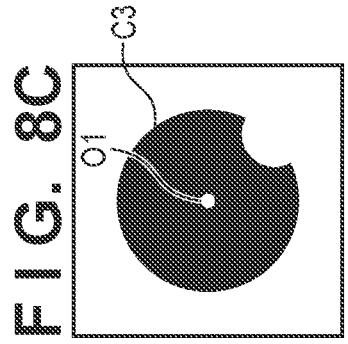
FIGS. 8A to 8G are views for describing an abnormality detection process of detecting an abnormality in a contact process.
Figure 8B:
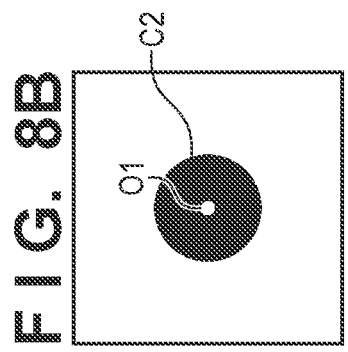
Figure 8C:
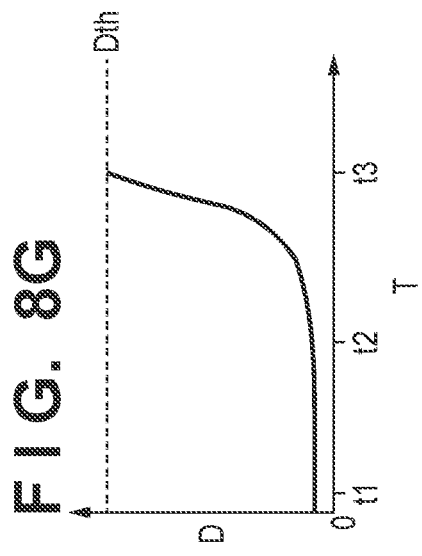
Figure 8D:
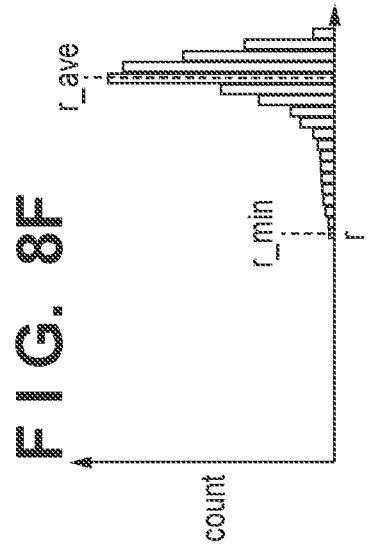
Figure 8E:
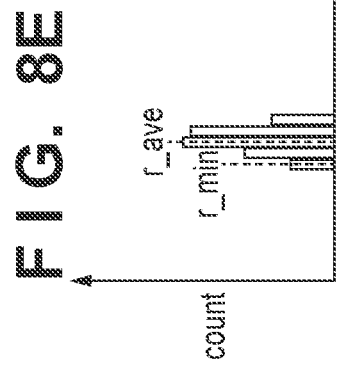
Figure 8F:
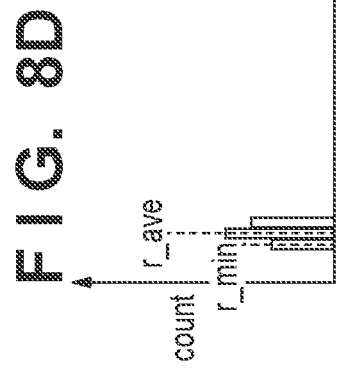

FIGS. 8A, 8B, and 8C show contact regions (observation images thereof) C1, C2, and C3 between the mold M and the imprint material IM at times t1, t2, and t3, respectively, and a center point O1 of the contact region. In FIGS. 8D, 8E, and 8F, the ordinate represents the count [count], and the abscissa represents the radius [r]. FIGS. 8D, 8E, and 8F show the histograms of the radius lists R at times t1, t2, and t3, respectively.

Figure 8G:
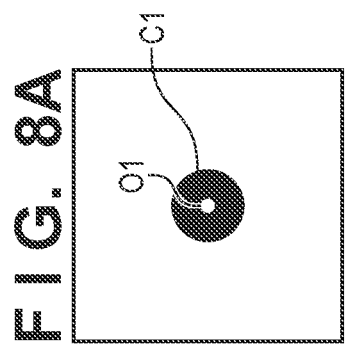

At times t1 and t2, as shown in FIGS. 8D and 8E, an average value r_ave and a minimum value r_min of the radius list R are close to each other. On the other hand, at time t3, as shown in FIG. 8F, the average value r_ave and the minimum value r_min of the radius list R are apart from each other. Here, let D be the difference between the average value r_ave and the minimum value r_min of the radius list R during execution of the abnormality detection process. Further, let Dth be a reference difference between the average value r_ave and the minimum value r_min of the radius list R obtained when the contact process is normally performed. Then, the difference D and the reference difference Dth are compared, and an abnormality in the contact process is detected in accordance with the magnitude relationship therebetween. In FIG. 8G, the ordinate represents a difference value D, and the abscissa represents time T. FIG. 8G shows the time-series changes of the difference value D until when the difference value D exceeds the reference difference value Dth and is detected as an abnormality. In this manner, the time-series changes of the difference value D are monitored, and when the difference value D exceeds the reference difference value Dth, the generation of an abnormality (the time of the generation of an abnormality) in the contact process is detected. Note that when obtaining the difference value D and the reference difference value Dth, the intermediate value (median value) may be used in place of the average value.

With reference to FIGS. 9A to 9G, a method of detecting, as an abnormality (an abnormality in the contact process), a state (FIG. 5C) in which the contact region between the mold M and the imprint material IM spreads in the respective directions at different speeds in the abnormality detection process performed in parallel with the contact process will be described. The elapse time from the start of the contact process to the detection of the abnormality is indicated by times t4, t5, and t6. Assume that the contact region (interference fringe) between the mold M and the imprint material IM spreads in accordance with the elapse time, and the variation of spreading speeds in the respective directions increases as the contact region spreads.

Figure 9A:
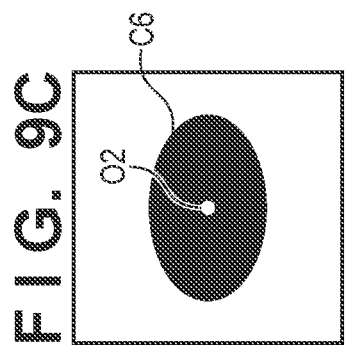
FIGS. 9A to 9G are views for describing an abnormality detection process of detecting an abnormality in the contact process.
Figure 9B:
Figure 9C:
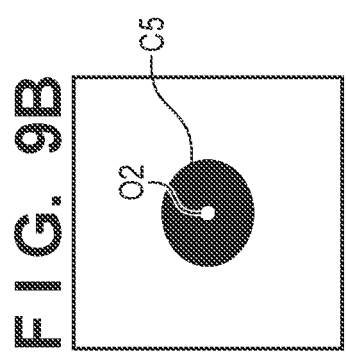
Figure 9D:
Figure 9E:
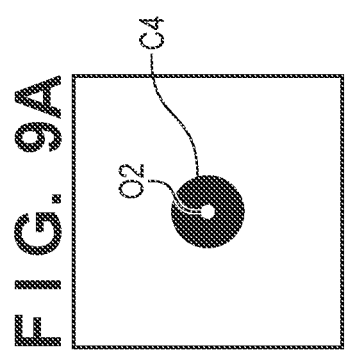
Figure 9F:

FIGS. 9A, 9B, and 9C show contact regions (observation images thereof) C4, C5, and C6 between the mold M and the imprint material IM at times t4, t5, and t6, respectively, and a center point O2 of the contact region. In FIGS. 9D, 9E, and 9F, the ordinate represents the count [count], and the abscissa represents the radius [r]. FIGS. 9D, 9E, and 9F show the histograms of the radius lists R at times t4, t5, and t6, respectively.

Figure 9G:
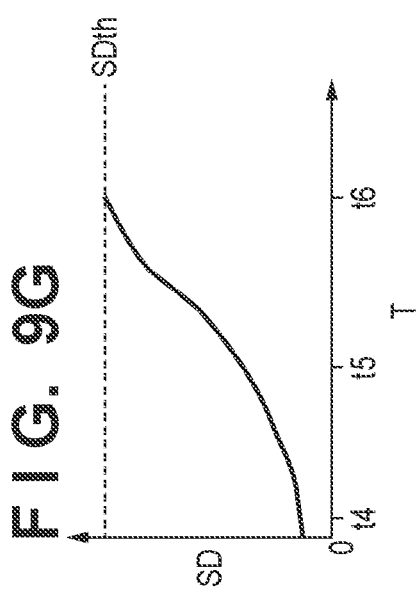

At time t4, as shown in FIG. 9D, the variation of the radii r in the radius list R is small. On the other hand, at times t5 and t6, as shown in FIGS. 9E and 9F, the variation of the radii r in the radius list R gradually increases. Here, let SD be the standard deviation indicating the variation of the radii r in the radius list R during execution of the abnormality detection process. Further, let SDth be a reference standard deviation indicating the variation of the radii r in the radius list R obtained when the contact process is normally performed. Then, the standard deviation SD and the reference standard deviation SDth are compared, and an abnormality in the contact process is detected in accordance with the magnitude relationship therebetween. In FIG. 9G, the ordinate represents the standard deviation SD, and the abscissa represents time T. FIG. 9G shows the time-series changes of the standard deviation SD until when the standard deviation SD exceeds the reference standard deviation SDth and is detected as an abnormality. In this manner, the time-series changes of the standard deviation SD are monitored, and when the standard deviation SD exceeds the reference standard deviation SDth, the generation of an abnormality (the time of the generation of an abnormality) in the contact process is detected.

With reference to FIGS. 10A to 10G, the abnormality detection process performed in parallel with the mold releasing process will be described. More specifically, a method of detecting, as an abnormality (an abnormality in the mold releasing process), a state (FIG. 6C) in which the contact region between the mold M and the imprint material IM decreases in the respective directions at different speeds in the abnormality detection process will be described. The elapse time from the start of the mold releasing process to the detection of the abnormality is indicated by times t7, t8, and t9. Assume that the contact region (interference fringe) between the mold M and the imprint material IM decreases in accordance with the elapse time, and the variation of the decreasing speeds in the respective directions increases as the contact region decreases.

FIGS. 10A, 10B, and 10C show the contact regions (observation images thereof) C7, C8, and C9 between the mold M and the imprint material IM at times t7, t8, and t9, respectively, and a center point O3 of the contact region. In FIGS. 10D, 10E, and 10F, the ordinate represents the count [count], and the abscissa represents the radius [r]. FIGS. 10D, 10E, and 10F show the histograms of the radius lists R at times t7, t8, and t9, respectively.

At time t7, as shown in FIG. 10D, the variation of the radii r in the radius list R is small. On the other hand, at times t8 and t9, as shown in FIGS. 10E and 10F, the variation of the radii r in the radius list R gradually increases. Here, let SDA be the standard deviation indicating the variation of the radii r in the radius list R during execution of the abnormality detection process. Further, let SDAth be the reference standard deviation indicating the variation of the radii r in the radius list R obtained when the mold releasing process is normally performed. Then, the standard deviation SDA and the reference standard deviation SDAth are compared, and an abnormality in the mold releasing process is detected in accordance with the magnitude relationship therebetween. In FIG. 10G, the ordinate represents the standard deviation SDA, and the abscissa represents time T. FIG. 10G shows the time-series changes of the standard deviation SDA until when the standard deviation SDA exceeds the reference standard deviation SDAth and is detected as an abnormality. In this manner, the time-series changes of the standard deviation SDA are monitored, and when the standard deviation SDA exceeds the reference standard deviation SDAth, the generation of an abnormality (the time of the generation of an abnormality) in the mold releasing process is detected.

As has been described above, in this embodiment, reference histogram obtained from the spread image acquired while the imprint process is normally performed is compared with the histogram obtained from the spread image acquired while the imprint process is actually performed. If the difference between the reference histogram and the histogram exceeds a threshold value, it is detected that an abnormality is generated in the imprint process.

Here, as a comparative example, the observation image of the contact region between the mold M and the imprint material IM acquired when the imprint process is normally performed is shown in each of FIGS. 15A to 15C. FIGS. 15A, 15B, and 15C show contact regions (observation images thereof) C10, C11, and C12 between the mold M and the imprint material IM at times t10, t11, and t12, respectively, and a center point O4 of the contact region. In FIGS. 15D, 15E, and 15F, the ordinate represents the count [count], and the abscissa represents the radius [r]. FIGS. 15D, 15E, and 15F show the histograms of the radius lists R at times t10, t11, and t12, respectively. In FIG. 15G, the ordinate represents the difference value D, and the abscissa represents the time T. FIG. 15G shows the time-series changes of the difference value D. In FIG. 15H, the ordinate represents the standard deviation SD, and the abscissa represents time T. FIG. 15H shows the time-series changes of the standard deviation SD.

Note that immediately before the completion of the contact process or immediately after the start of the mold releasing process, a part of the contact region (interference fringe) between the mold M and the imprint material IM reaches the end portion of the shot region, that is, the end portion of the mold M (pattern surface MP thereof), so that the spread image as shown in FIG. 3G is acquired. In this case, when the abnormality detection process is performed using the point group P representing the contour shape of the contact region between the mold M and the imprint material IM intact, an abnormality in the imprint process may not be detected correctly. In this case, of the point group P (the plurality of points) representing the contour shape of the contact region between the mold M and the imprint material IM, a point that has reached a position corresponding to the end portion of the mold M and does not change is excluded from the statistical processing for obtaining a statistic value.

Figure 11A:
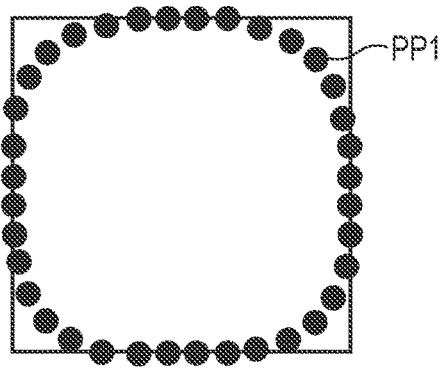
FIGS. 11A and 11B are views each for describing an abnormality detection process of detecting an abnormality in the imprint process.
Figure 11B:
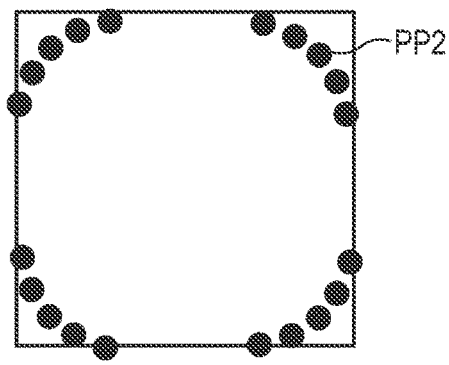

With reference to FIGS. 11A and 11B, an abnormality detection process for correctly detecting an abnormality in the imprint process even when a part of the contact region (interference fringe) between the mold M and the imprint material IM has reached the end portion of the mold M will be described more specifically. FIG. 11A shows a point group PP1 representing the contour shape of the contact region between the mold M and the imprint material IM extracted from the spread image shown in FIG. 3G. Referring to FIG. 11A, since the point group PP1 includes the points having reached the end portion (the position corresponding thereto) of the mold M (pattern surface MP thereof), it is not preferable to perform the abnormality detection process using the statistic value obtained with the point group PP1 as a sample. Therefore, of the point group PP1, the points having reached the end portion of the mold M are excluded to obtain a new point group PP2 as shown in FIG. 11B. Then, by using the statistic value obtained with the point group PP2 as a sample, the abnormality detection process can be performed while placing focus only on the points not having reached the end portion of the mold M. Thus, an abnormality in the imprint process can be correctly detected.

Note that in order to exclude the point having reached the end portion of the mold M from the pint group representing the contour shape of the contact region between the mold M and the imprint material IM, the coordinate information (position information) of the end portion (the end portion of the shot region) of the mold M (pattern surface MP thereof) is required. The coordinate information of the end portion of the mold M may be acquired in advance from design information or the like. Alternatively, an edge portion may be extracted from the spread image, and the coordinate information of the edge portion may be used as the coordinate information of the end portion of the mold M. When extracting the edge portion from the spread image, by using the spread image acquired before the start of the contact process or the mold releasing process or after the end thereof, the edge portion (the edge portion of the mold M) alone can be extracted.

Also in a case in which a part of the contact region (interference fringe) between the mold M and the imprint material IM has reached the outer periphery of the substrate S as shown in FIG. 3H, the abnormality detection process is preferably performed as in the case in which a part of the contact region between the mold M and the imprint material IM has reached the end portion of the mold M. More specifically, by performing the abnormality detection process while excluding the point having reached the outer periphery of the substrate S from the point group representing the contact region between the mold M and the imprint material IM, an abnormality in the imprint process can be correctly detected.

Figure 12A:
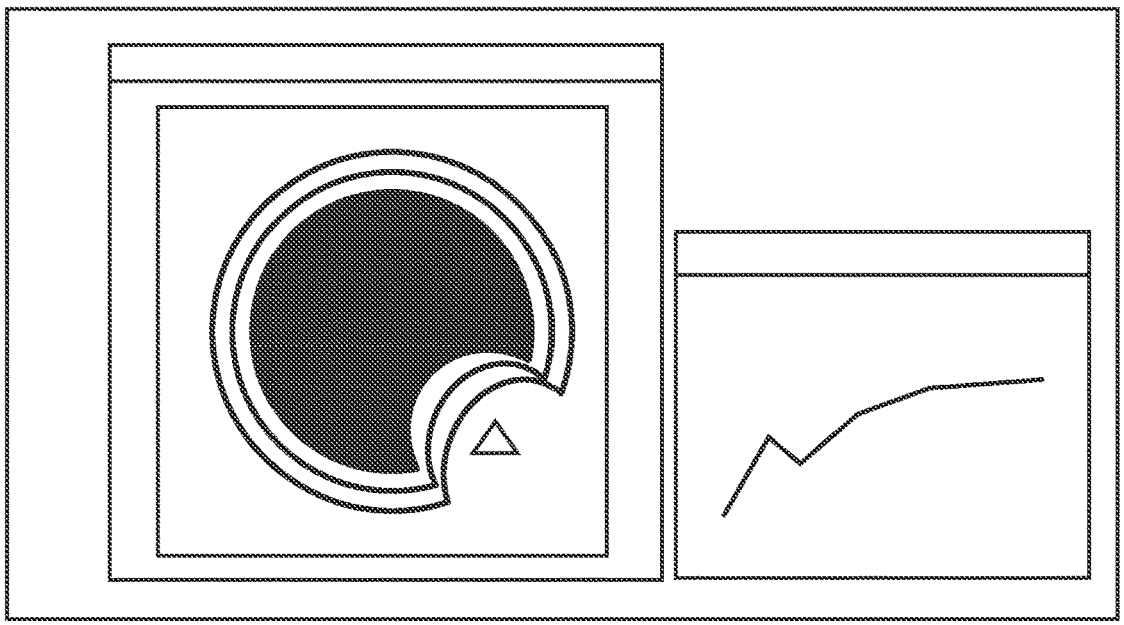
FIGS. 12A and 12B are views each showing an example of an image provided via a display apparatus included in the imprint apparatus shown in FIG. 1A.
Figure 12B:
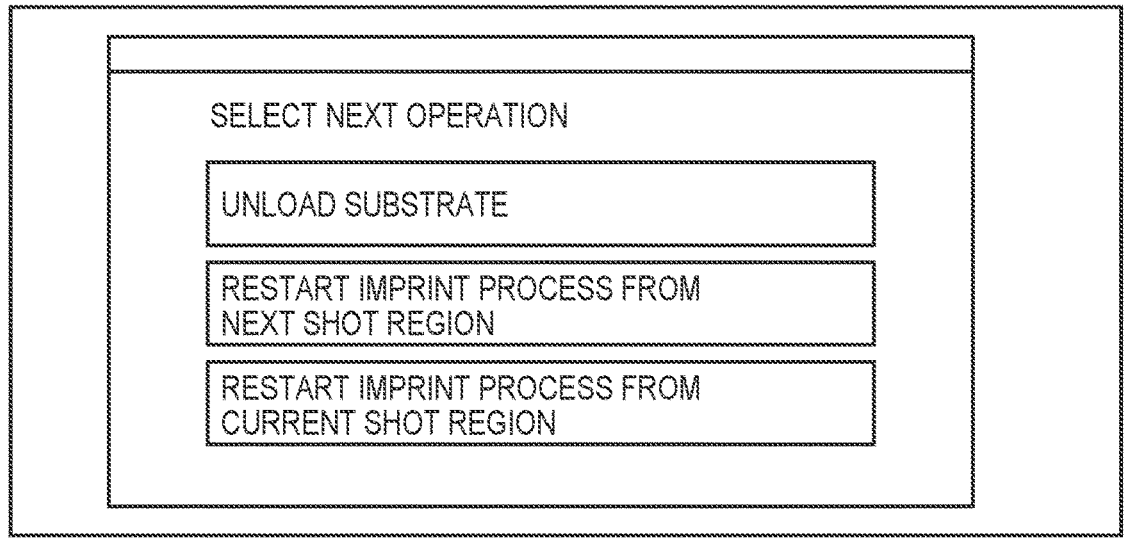

Next, an operation of the imprint apparatus IMP in a case in which an abnormality in the imprint process has been detected by performing the abnormality detection process will be described. When an abnormality in the imprint process is detected, the imprint apparatus IMP basically stops the imprint process. When the imprint process is stopped, the control unit 110 provides, via a display apparatus (monitor) provided in the imprint apparatus IMP, an image (abnormality information) indicating that the abnormality is generated in the imprint process, and an image for selecting the next process. More specifically, as shown in FIG. 12A, the control unit 110 provides an image (abnormality information) in which the portion where the abnormality has been detected is superimposed on the spread image, or an image showing the statistic value at the time of the detection of the abnormality. Note that the control unit 110 may display, as a moving image, a plurality of spread images (spread images that are continuous in time series) including the spread image in which the abnormality has been detected. As an image for selecting the next process, as shown in FIG. 12B, the control unit 110 provides an image for selecting one of "unload the substrate", "restart of the imprint process from the next shot region", and "restart of the imprint process from the current shot region".

As has been described above, in this embodiment, a plurality of points representing the contour shape including a portion where the mold M and the imprint material IM on the substrate are in contact with each other are obtained from the spread image, and an abnormality in the imprint process is detected based on the plurality of points. With this, it is possible to provide the imprint apparatus IMP advantageous in detecting an abnormality in the imprint process, so that in the imprint apparatus IMP, a defect in the pattern formed on a substrate and damage of the pattern of a mold can be suppressed. Therefore, the imprint apparatus IMP is advantageous in terms of manufacturing productivity of a device such as a semiconductor device.

Note that in this embodiment, the example has been described in which the abnormality detection process of detecting an abnormality is performed together with the contact process (step S103) in the control unit 110 (processing unit 113 including an information processing apparatus) of the imprint apparatus IMP. However, the abnormality detection process may be performed while making an information processing apparatus such as an external server connected to the imprint apparatus IMP function as the processing unit 113. In this case, the external server acquires, from the imprint apparatus IMP, the spread image obtained by the image capturing unit 112, and performs the abnormality detection process based on the spread image. At this time, a result of the abnormality detection process may be displayed on a display apparatus (monitor) other than the display apparatus included in the imprint apparatus IMP.

Figure 16A:
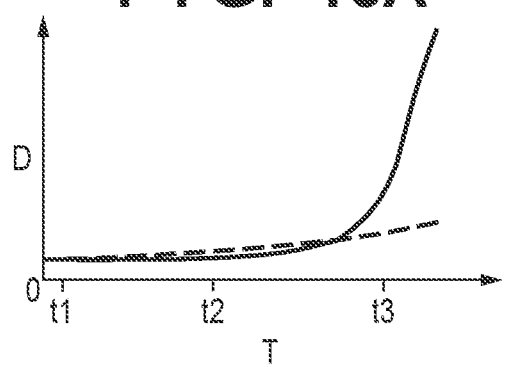
FIGS. 16A and 16B are graphs each showing an example of information from which a contact state between a mold and an imprint material can be evaluated.
Figure 16B:
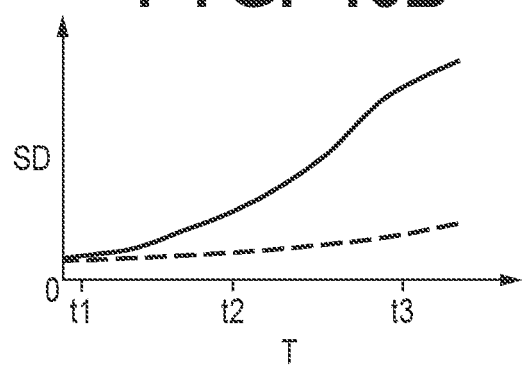

Further, in this example, the case in which the process until detecting an abnormality in the imprint process is performed by the control unit 110 has been described as an example. However, the present invention is not limited to this. For example, information indicating the contact state between the mold M and the imprint material IM (composition) on the substrate may be output from the imprint apparatus IMP, and a user (person) may detect (determine) an abnormality in the imprint process based on the information. More specifically, by displaying, on the display apparatus, the spread image or the image showing the statistic value at the time of the detection of the abnormality as shown in FIG. 12A, or outputting the coordinate data of the portion where the abnormality has been detected, the user can detect the abnormality. At this time, as shown in FIG. 12A, the spread image and the statistic value (the difference value D or the standard deviation SD) may be displayed simultaneously, or the statistic values (the difference value D and the standard deviation SD) different from each other may be superimposed and displayed on each other. Further, as shown in FIG. 16A, the difference value D (dashed line) as shown in FIG. 15G, which is obtained when the imprint process is correctly performed, may be superimposed and displayed on the difference value D (solid line) obtained in the statistical processing. Alternatively, as shown in FIG. 16B, the standard deviation SD (dashed line) as shown in FIG. 15H, which is obtained when the imprint process is correctly performed, may be superimposed and displayed on the standard deviation SD (solid line) obtained in the statistical processing. By displaying the image as described above on the display apparatus, the user can intuitively detect (determine) an abnormality in the imprint process. Note that such information from which the contact state between the mold M and the imprint material IM can be evaluated may be output in real time during execution of the imprint process including the contact process (step S103), or may be output at a timing of completion of the imprint process.

The pattern of a cured product formed using the imprint apparatus IMP is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 13A:
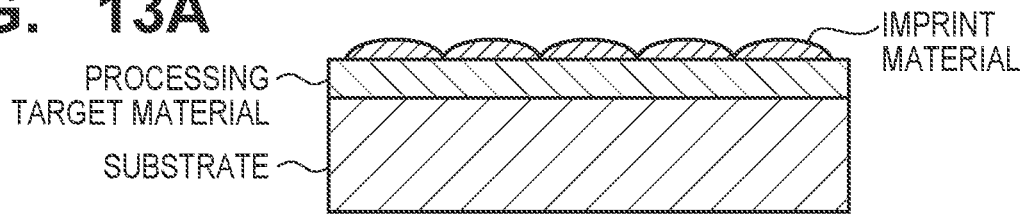
FIGS. 13A to 13F are views for describing an article manufacturing method.

A detailed article manufacturing method will be described next. As shown in FIG. 13A, a substrate such as a silicon wafer with a work material such as an insulator formed on the surface is prepared, and an imprint material is applied to the surface of the work material by an ink-jet method or the like. A state in which the imprint material formed as a film continuously covering the surface of the substrate is applied onto the substrate is shown here.

Figure 13B:
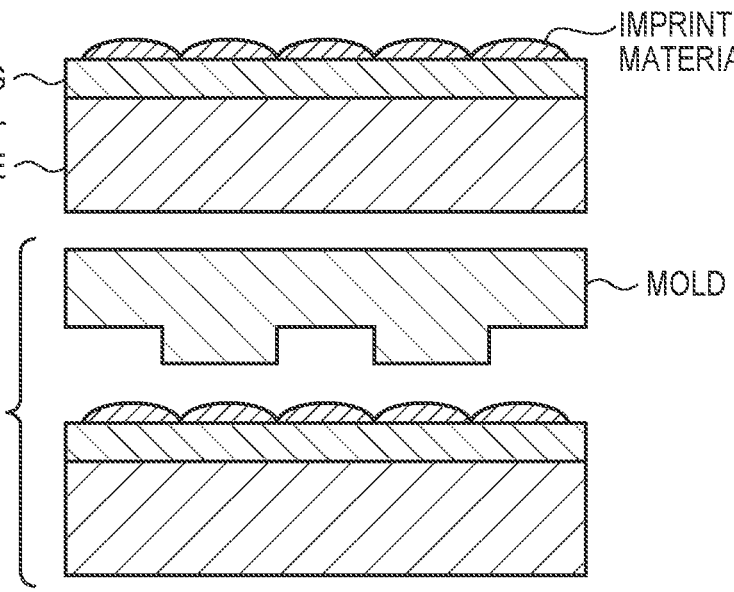
Figure 13C:
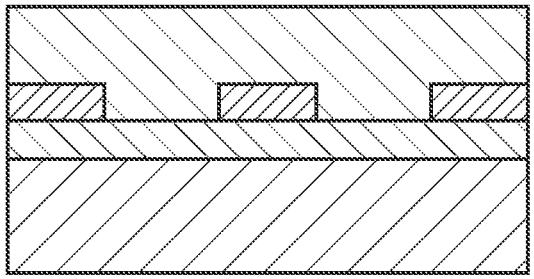

As shown in FIG. 13B, a side of the mold for imprint with a projection and groove pattern is formed on and caused to face the imprint material on the substrate. As illustrated in FIG. 13C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 13D:
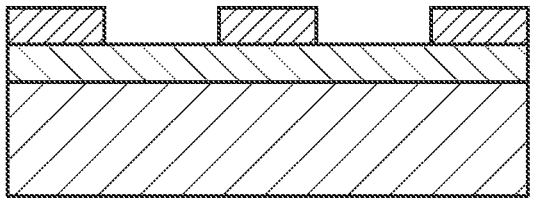

As shown in FIG. 13D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

Figure 13E:
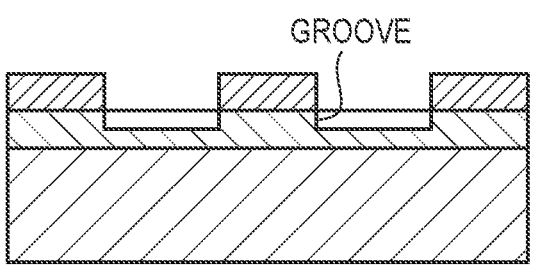
Figure 13F:
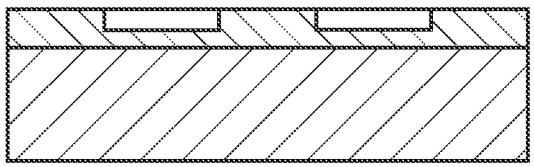

As shown in FIG. 13E, when etching is performed using the pattern of the cured product as an etching resistant mask, a portion of the surface of the processed material where the cured product does not exist or remains thin is removed to form a groove. As shown in FIG. 13F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

Note that in this embodiment, a circuit pattern transfer mold on which an uneven pattern is formed has been described as the mold M. The mold M may be a mold (plane template) having a plane portion where no uneven pattern is formed. The plane template is used in a planarization apparatus (molding apparatus) that performs planarization processing (molding processing) of performing molding such that a composition on a substrate is planarized by the plane portion. The planarization processing includes a step of curing a curable composition by light irradiation or heating in a state in which the plane portion of the plane template is in contact with the curable composition supplied onto the substrate. As described above, this embodiment can be applied to a molding apparatus configured to mold a composition on a substrate using a plane template.

Figure 14A:
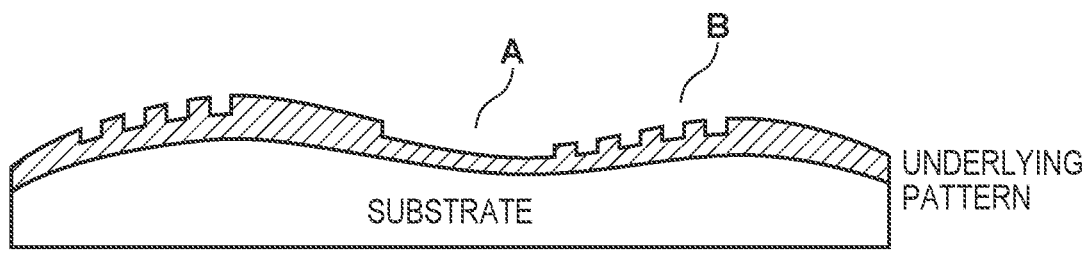
FIGS. 14A to 14D are views for describing a case in which the imprint apparatus shown in FIG. 1A is used as a planarization apparatus.

The underlying pattern on the substrate has an uneven profile derived from the pattern formed in the previous step. In particular, with the recent multilayered structure of a memory element, the substrate (process wafer) may have a step of about 100 nm. The step derived from a moderate undulation of the entire substrate can be corrected by the focus following function of an exposure apparatus (scanner) used in the photolithography step. However, an unevenness with a small pitch fitted in the exposure slit area of the exposure apparatus directly consumes the DOF (Depth Of Focus) of the exposure apparatus. As a conventional technique of planarizing the underlying pattern of a substrate, a technique of forming a planarization layer, such as SOC (Spin On Carbon) or CMP (Chemical Mechanical Polishing), is used. In the conventional technique, however, as shown in FIG. 14A, an unevenness suppressing rate of only 40% to 70% is obtained in the boundary portion between an isolated pattern region A and a repetitive dense (concentration of a line & space pattern) pattern region B, and sufficient planarization performance cannot be obtained. The unevenness difference of the underlying pattern caused by the multilayered structure tends to further increase in the future.

As a solution to this problem, U.S. Pat. No. 9,415,418 proposes a technique of forming a continuous film by application of a resist serving as a planarization layer by an inkjet dispenser and pressing by a plane template. Also, U.S. Pat. No. 8,394,282 proposes a technique of reflecting a topography measurement result on a substrate side on density information for each position to instruct application by an inkjet dispenser. An imprint apparatus IMP can particularly be applied as a planarization processing (planarization) apparatus for performing local planarization in a substrate surface by pressing not the mold 1 but a plane template against an uncured resist applied in advance.

FIG. 14A shows a substrate before planarization processing. In the isolated pattern region A, the area of a pattern convex portion is small. In the repetitive dense pattern region B, the ratio of the area of a pattern convex portion to the area of a pattern concave portion is 1:1. The average height of the isolated pattern region A and the repetitive dense pattern region B changes depending on the ratio of the pattern convex portion.

Figure 14B:
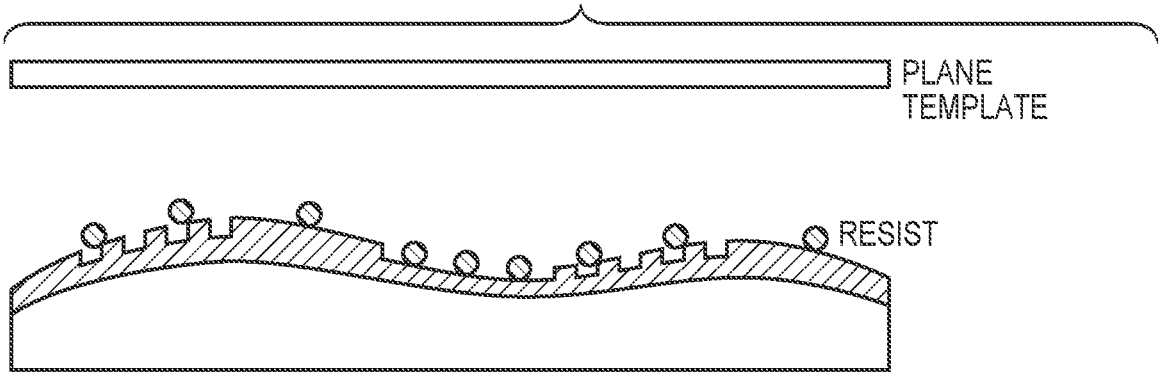

FIG. 14B shows a state in which the resist that forms the planarization layer is applied to the substrate. FIG. 14B shows a state in which the resist is applied by an inkjet dispenser based on the technique proposed in U.S. Pat. No. 9,415,418. However, a spin coater may be used to apply the resist. In other words, the imprint apparatus IMP can be applied if a step of pressing a plane template against an uncured resist applied in advance to planarize the resist is included.

Figure 14C:
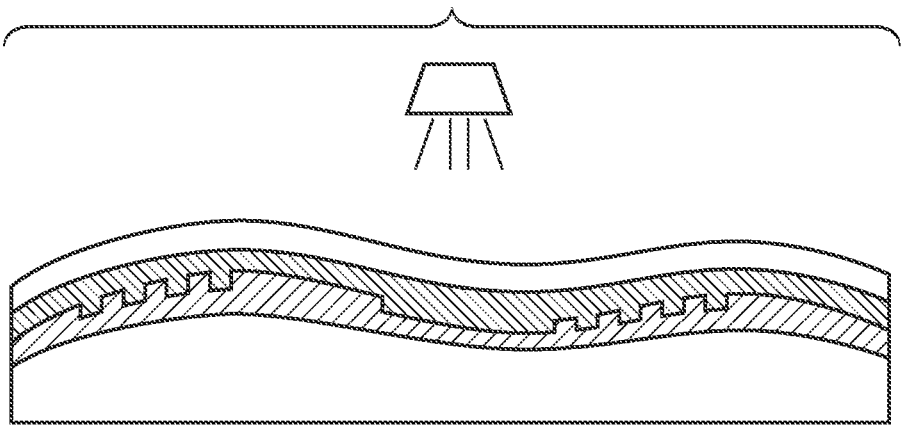
Figure 14D:
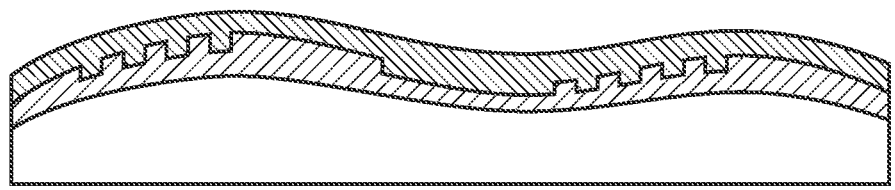

As shown in FIG. 14C, the plane template is made of glass or quartz that passes UV rays, and the resist is cured by irradiation of UV rays from a light source. For the moderate unevenness of the entire substrate, the plane template conforms to the profile of the substrate surface. After the resist is cured, the plane template is separated from the resist, as shown in FIG. 14D.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2021-126048 filed on Jul. 30, 2021 and Japanese Patent application No. 2022-067826 filed on Apr. 15, 2022, which are hereby incorporated by reference herein in its entirety.

What is claimed is:

1. An information processing apparatus for controlling a molding apparatus that performs a molding process of molding a composition on a substrate using a mold, the molding apparatus comprising an image capturing unit configured to capture an image by irradiating the substrate with light via the mold, and detecting reflected light from the mold and reflected light from the substrate, wherein the molding process includes a contact process of bringing the mold and the composition into contact with each other so as to gradually increase a contact portion where the mold and the composition on the substrate are in contact with each other, and a mold releasing process of separating the mold from the composition so as to gradually decrease the portion, the information processing apparatus comprising:

a processing unit configured to:
obtain a plurality of points representing a contour shape of the contact portion for each of a plurality of images captured in time series by the imaging capturing unit while the contact process or the mold releasing process is being performed;
for each of the plurality of images, obtain a statistic value by performing statistical processing for the obtained plurality of points obtained from each image;
detect an abnormality in the molding process based on the obtained statistical value; and
control the molding apparatus based on the detected abnormality.

2. The apparatus according to claim 1, wherein, for each of the plurality of images, the processing unit:
obtains a distance between a reference point within the contour shape and each of the plurality of points; and
detects an abnormality in the molding process based on a histogram regarding the distance obtained by performing statistical processing for the distances.

3. The apparatus according to claim 2, wherein the processing unit detects an abnormality in the molding process based on a difference between an average value and a minimum value of the distances in the histogram.

4. The apparatus according to claim 2, wherein the processing unit detects an abnormality in the molding process based on a standard deviation representing a variation of the distances in the histogram.

5. The apparatus according to claim 2, wherein the processing unit detects the abnormality in the molding process by comparing the histogram with a reference histogram regarding the distances obtained from the plurality of images while the at least one process is normally performed.

6. The apparatus according to claim 5, wherein, in a state where a difference between the reference histogram and the histogram exceeds a threshold value, the processing unit detects the abnormality in the molding process.

7. The apparatus according to claim 1, wherein the statistic value includes at least one of a maximum value, a minimum value, an average value, an intermediate value, and a standard deviation.

8. The apparatus according to claim 1, wherein the processing unit excludes, from the statistical processing, a point among the plurality of points that has reached a position corresponding to an end portion of the mold and does not change.

9. The apparatus according to claim 1, wherein the contour shape includes one of a shape of a contour of the portion and a shape of a contour of a fringe closest to the portion among a plurality of light-dark fringes formed around the portion.

10. The apparatus according to claim 1, wherein the control of the molding apparatus includes stopping the molding process upon detecting the abnormality in the molding process.

11. The apparatus according to claim 1, wherein the processing unit detects the abnormality in the molding process based on time series changes of the obtained statistic value.

12. The apparatus according to claim 1, wherein the processing unit obtains the plurality of points while both the contact process and the mold releasing process are being performed.

13. A molding apparatus that performs a molding process of molding a composition on a substrate using a mold, wherein the molding process includes a contact process of bringing the mold and the composition into contact with each other so as to gradually increase a contact portion where the mold and the composition on the substrate are in contact with each other, and a mold releasing process of separating the mold from the composition so as to gradually decrease the contact portion, the apparatus comprising:
an image capturing unit configured to capture an image by irradiating the substrate with light via the mold, and detecting reflected light from the mold and reflected light from the substrate; and
a processing unit configured to:
obtain a plurality of points representing a contour shape of the contact portion for each of a plurality of images captured in time series by the image capturing unit while the contact process or the mold releasing process is being performed;
for each of the plurality of images, obtain a statistic value by performing statistical processing for the obtained plurality of points obtained from each image;
detect an abnormality in the molding process based on the obtained statistical value; and
control the molding apparatus based on the detected abnormality.

14. The apparatus according to claim 13, wherein
the mold includes a pattern, and
the apparatus forms a pattern in a film of the composition on the substrate by bringing the pattern of the mold into contact with a droplet of the composition on the substrate.

15. The apparatus according to claim 13, wherein
the mold includes a plane portion, and
the apparatus planarizes a film of the composition on the substrate by bringing the plane portion of the mold into contact with a droplet of the composition on the substrate.

16. A molding method of performing a molding process of molding a composition on a substrate using a mold, wherein the molding process includes a contact process of bringing the mold and the composition into contact with each other so as to gradually increase a contact portion where the mold and the composition on the substrate are in contact with each other, and a mold releasing process of separating the mold from the composition so as to gradually decrease the contact portion, the method comprising:
capturing an image by irradiating the substrate with light via the mold and detecting reflected light from the mold and reflected light from the substrate; and
obtaining a plurality of points representing a contour shape of the contact portion for each of a plurality of images captured in time series while the contact process or the mold releasing process is being performed;
for each of the plurality of images, obtaining a statistic value by performing statistical processing for the obtained plurality of points obtained from each image;
detecting an abnormality in the molding process based on the obtained statistical value; and
controlling the molding apparatus based on the detected abnormality.

17. An article manufacturing method comprising:
molding an uncured composition arranged on a substrate using the molding apparatus defined in claim 13;
processing the substrate on which the composition is molded in the molding; and
manufacturing an article from the processed substrate.

* * * * *